(12) United States Patent
  Nozawa

(10) Patent No.: US 9,960,033 B1
(45) Date of Patent: May 1, 2018

(54) METHOD OF DEPOSITING AND ETCHING SI-CONTAINING FILM

(71) Applicant: ASM IP HOLDING B.V., Almere (NL)

(72) Inventor: Toshihisa Nozawa, Kawasaki (JP)

(73) Assignee: ASM IP HOLDING B.V., Almere (NL)

( * ) Notice: Subject to any disclaimer, the term of this patent is extended or adjusted under 35 U.S.C. 154(b) by 0 days. days.

(21) Appl. No.: 15/382,081

(22) Filed: Dec. 16, 2016

(51) Int. Cl.
  *H01L 21/02* (2006.01)
  *H01L 21/311* (2006.01)

(52) U.S. Cl.
  CPC ...... *H01L 21/0228* (2013.01); *H01L 21/0217* (2013.01); *H01L 21/02164* (2013.01); *H01L 21/02214* (2013.01); *H01L 21/02219* (2013.01); *H01L 21/02274* (2013.01); *H01L 21/31116* (2013.01)

(58) Field of Classification Search
  None
  See application file for complete search history.

(56) References Cited

U.S. PATENT DOCUMENTS

| 8,197,915 B2 | 6/2012 | Oka et al. |
| 8,669,185 B2 | 3/2014 | Onizawa et al. |
| 2010/0140802 A1 | 6/2010 | Matsumoto et al. |
| 2014/0134827 A1* | 5/2014 | Swaminathan ... H01L 21/76224 438/437 |
| 2017/0148628 A1* | 5/2017 | Swaminathan ... H01L 21/02123 |

FOREIGN PATENT DOCUMENTS

| JP | 2013/219380 | 10/2013 |
| JP | 2016/021463 | 2/2016 |

OTHER PUBLICATIONS

G. Dingemans et al., "Plasma-Assisted Atomic Layer Deposition of Low Temperature $SiO_2$," ECS Transactions, vol. 35, No. 4, pp. 191-204 (2011).

* cited by examiner

*Primary Examiner* — Asok K Sarkar
(74) *Attorney, Agent, or Firm* — Pillsbury Winthrop Shaw Pittman LLP

(57) ABSTRACT

A method of filling recesses or grooves on a patterned surface with a layer of film, by combining depositing a film by PEALD/PPECVD on the patterned surface and etching the film, wherein the deposition and the etching are separately controlled, and wherein the conditions for deposition can be controlled by controlling RF power.

19 Claims, 6 Drawing Sheets

METHOD OF DEPOSITING AND ETCHING SI-CONTAINING FILM

BACKGROUND

1. Field

The present disclosure relates generally to a method of repeating multiple times deposition of a silicon-containing film by plasma enhanced atomic layer deposition (PEALD) or pulsed plasma enhanced chemical vapor deposition (PPECVD), and etching only a silicon-containing film on a side wall of a recess or etching a silicon-containing film on a side wall of a recess more than a top wall of the recess, so as to fill the recess with a layer of silicon-containing film.

2. Description of the Related Art

PPECVD/PEALD processes can provide high conformality (also referred to as "coverage") of depositing films on a patterned surface on which multiple recesses or grooves are formed in patterns for establishing interconnects. The substrate temperature of PEALD processes are typically lower than that of thermal ALD, and PEALD processes are typically better than thermal ALD in terms of deposition rates and controllability, depending on the type of films.

Any discussion of the background art which has been included in the present disclosure is solely for the purpose of providing a context for the present invention, and it should not be taken as an admission that any or all of the discussion form part of the prior art or were known in the art at the time the invention was made.

SUMMARY

In recent years, methods for tailoring conformality of a film deposited on a patterned surface have been proposed by combining depositing a film by PEALD/PPECVD processes on the patterned surface and etching the film. Normally, the cycle of this combination is repeated multiple times to form a target layer on a patterned surface.

The demand for filling recesses or grooves with a film formed on the patterned surface especially with high aspect ratios and/or narrow recesses is increasing, however, conventional depositing and etching technology may be difficult to perform gap-filling without forming a void (See FIG. 8 as one example of this problem). Thus, development of depositing and etching technology which is capable of filling recesses or grooves with the film without forming a void becomes important.

In an aspect, an embodiment of the present invention provides a method of filling, with layers of film, recesses or grooves on a patterned surface, by depositing a film by PEALD/PPECVD and etching the film on the patterned surface, wherein a film with different film quality is formed on a top wall and on a side wall of the recesses or grooves on the patterned surface. The deposition and etching sessions are conducted repeatedly until a desirable thickness of a target layer of film is formed.

In some embodiments, the etching can be in situ plasma etching (etching gas is excited in the reactor) or remote plasma etching (etching gas is excited in a remote plasma unit). In some embodiments, deposition and etching are conducted in the same reactor, and alternatively, etching is conducted in a reactor different from that for deposition. The combination of a deposition session and an etching session can be repeated multiple times to form a desired target layer of film on a patterned surface, which fills recesses or grooves without forming a void.

In some embodiments, the film is a silicon nitride film. In some embodiments, the film is a silicon oxide film. In some embodiments, a combination of pulsed deposition and pulsed etching is used for forming a film, and a set of pulsed deposition and pulsed etching is repeated until recesses or grooves are filled with the desired layer of film.

For purposes of summarizing aspects of the invention and one or more advantages achieved over the related art, certain objects and advantages of the invention are described in this disclosure. Of course, it is to be understood that not necessarily all or any such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DESCRIPTION OF EMBODIMENTS

The present invention includes, but is not limited to, the following embodiments:

In an embodiment, $SiO_2$ film deposition conditions may be set as follows, for example:

Substrate temperature: 100-300° C.
RF power (13.56 MHz): 20 to 300 W
Film deposition pressure: 200-1000 Pa
Flow rate of silicon-containing precursor: 300 sccm
Flow rate of oxygen: 1000 sccm
Flow rate of purge gas (such as Ar): Approx. 1500 sccm In an embodiment, a desired pressure can be selected within a range of approx. 100 to 1000 Pa, and a desired flow rate of purge gas can be selected within a range of 1000 to 2500 sccm.

Figure 1:
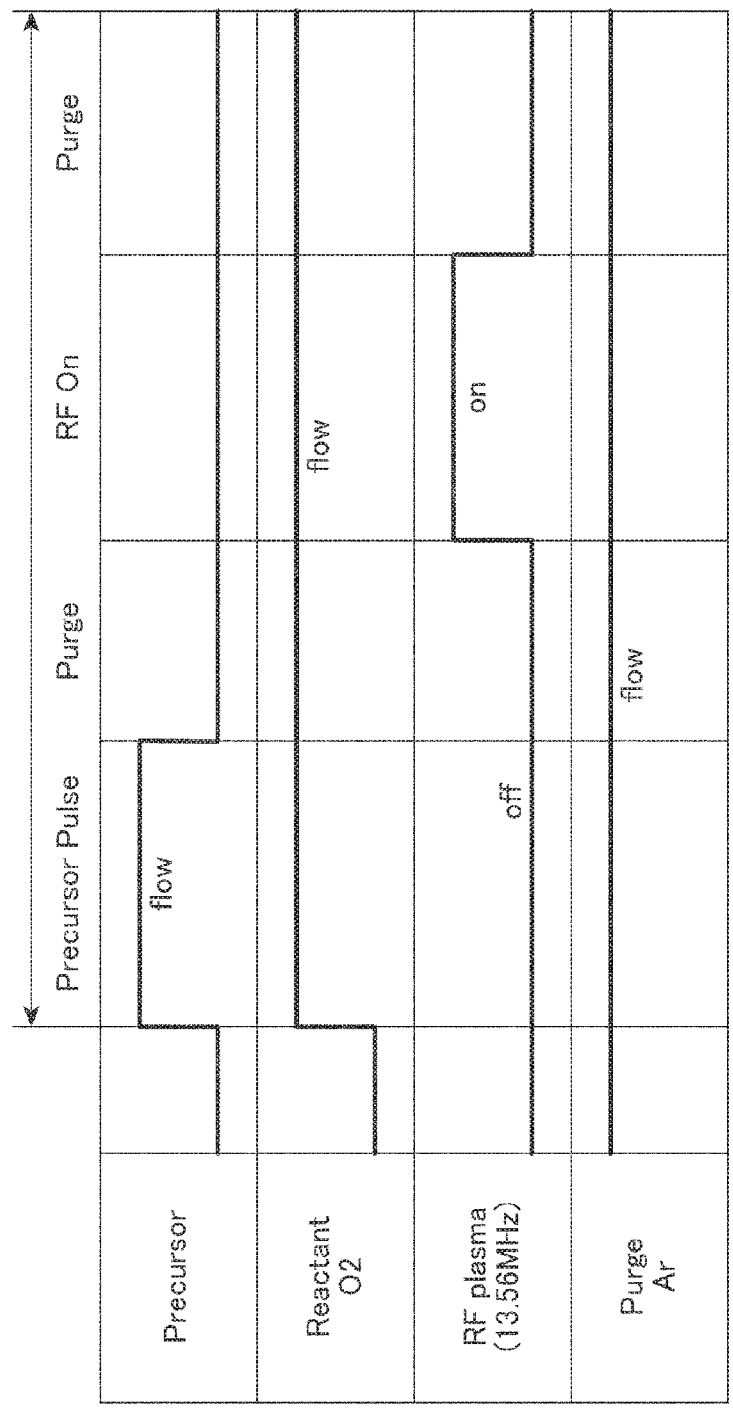
FIG. 1 is a timing chart for one cycle for depositing a $SiO_2$ ALD film by PEALD according to an embodiment of the present invention.

FIG. 1 is one example of a timing chart of one PEALD cycle. First, purge gas is controlled to flow into the reactor and the flow is stabilized, after which purge gas will always flow within the reactor at a constant rate. And then, silicon precursor is supplied with a single pulse, while oxygen reactant gas is introduced to the reactor continuously at a constant rate. After the silicon-containing precursor pulse stops and the unabsorbed silicon-containing gas is purged, RF power is applied with a single pulse. The silicon-containing precursor pulse and the RF power pulse do not overlap with each other. Along with the continuous flow of purge gas, the reactor is always evacuated and a constant pressure is maintained. Purge gas continues to flow in even while silicon precursor is being introduced via pulsing. Once the silicon precursor pulse stops, however, only purge gas and oxygen reactant gas will flow in and therefore virtually all silicon-containing precursor can be purged from the substrate surface. In an embodiment, the thickness of $SiO_2$ film achieved in one cycle is roughly completely and linearly dependent upon the film deposition temperature, where the film deposition speed rises as the film deposition temperature drops. In an embodiment, the film deposition speed is approx. 0.1 nm/cycle when the film deposition temperature is approx. 200° C. In an embodiment, oxygen reactant gas and purge gas can be introduced using pulses in the above PEALD cycle. Also, each gas need not comprise one type of gas only, but a mixture of multiple types of gases can also be used. In one embodiment, the silicon nitride film can be formed by PEALD. In another embodiment, the deposition of film can be performed by pulsed PECVD.

Figure 2:
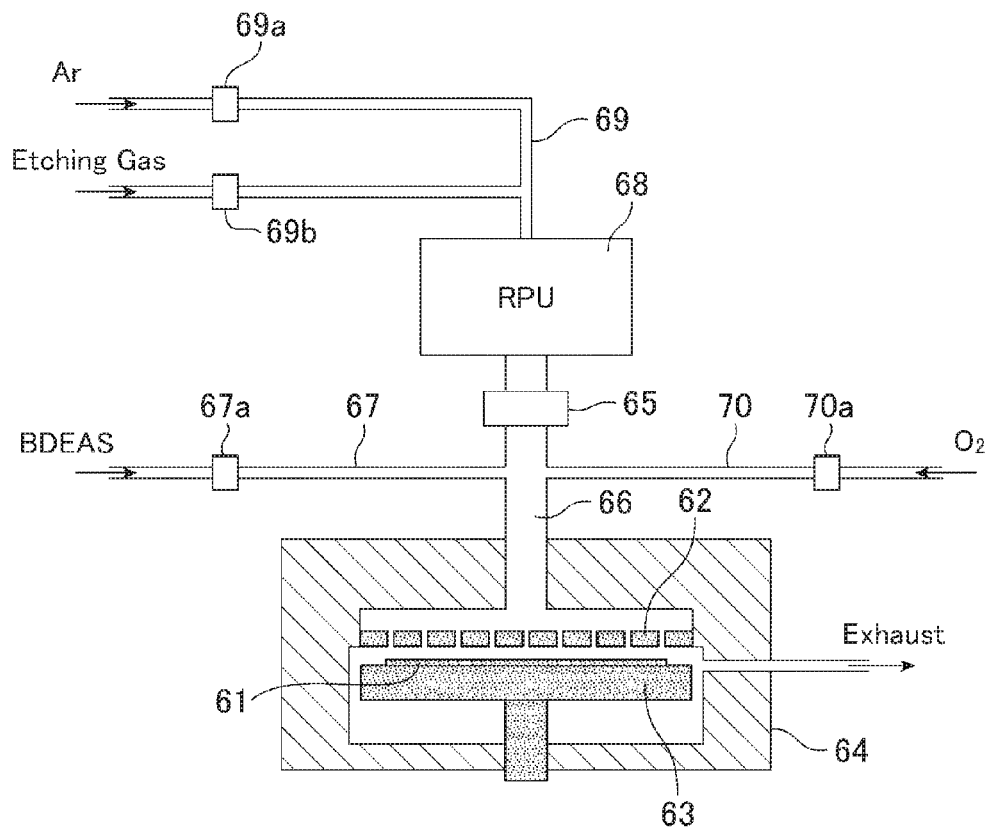
FIG. 2 is a schematic drawing showing a reactor used for deposition and etching according to an embodiment of the present invention.

As illustrated in FIG. 2, a substrate 61 is placed on a susceptor 63 in a reaction chamber 64 configured to be evacuated. A shower plate 62 is disposed parallel to the susceptor 63. During the deposition session according to the sequence illustrated in FIG. 1, Bisdiethylaminosilane (BDEAS) as the silicon-containing precursor is introduced in pulses into the reaction chamber 64 through a valve 67a, a line 67, a gas inlet port 66, and the shower plate 62. $O_2$ is introduced continuously or in pulses into the reaction chamber 64 through a valve 70a, a line 70, the gas inlet port 66, and the shower plate 62. The gas inside the reaction chamber 64 is discharged through an exhaust port. RF power from a RF power source (not shown) is applied to the shower plate 62, and the susceptor 63 is grounded (not shown). After the deposition session, etching is initiated.

During the etching session, Ar is introduced into the reaction chamber 64 through a valve 69a, a line 69, a remote plasma unit (RPU) 68, a valve 65, the gas inlet port 66, and the shower plate 62. The etching gas is also introduced into the reaction chamber 64 through a valve 69b, a line 69, the remote plasma unit 68, the valve 65, the gas inlet port 66, and the shower plate 62. The etching gas is activated by RPU 68. The gas inside the reaction chamber 64 is discharged through an exhaust port. In an embodiment, the RF power may be applied using capacitively coupled parallel electrodes, and the susceptor functions as a lower electrode and holds a single substrate.

Although FIG. 2 illustrates an apparatus in which the deposition and the etching are conducted in the same reaction chamber, and purging is conducted therebetween, the deposition and the etching can be conducted in different reaction chambers, and during the intermediate period between the deposition session and the etching session, the substrate may be transferred to the next reaction chamber.

Figure 8:
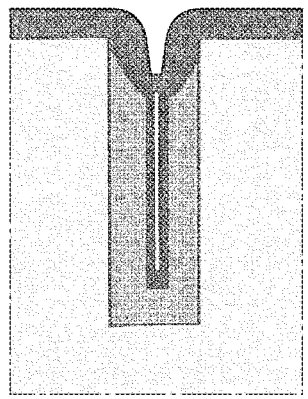
FIG. 8 is a schematic drawing showing deposition and etching of a layer of film according to a conventional deposition and etching method.

By controlling the deposition session prior to etching the film on a side wall of recesses or grooves on a substrate, the film deposited on a side wall of recesses or grooves on a substrate may only be etched or mainly etched in the etching session. Also, by controlling the deposition session prior to etching the film on a side wall of recesses or grooves on a substrate it is possible, during the etching session, to not etch or to only minimally etch the film deposited on a top wall of recesses or grooves on a substrate, and by repeating the deposition session and etching session in this manner, it becomes possible to fill recesses or grooves with a layer of film without forming a void therein (See FIG. 8 for background art of a layer of film formed in recesses or grooves with a void). In one embodiment, it is possible to deposit a film with different film quality on a top wall and on a side wall of recesses and by doing so it becomes possible to conduct the etching session to selectively etch the film on a side wall of recesses or grooves with no etching or only minimal etching of the film deposited on a top wall of recesses or grooves on a substrate.

In one embodiment, it becomes possible to deposit a film with different film quality on a top wall and on a side wall of recesses by controlling RE power applied. In another embodiment, the deposition process is conducted by setting the ratio of the RE power to a substrate (e.g., a wafer) diameter to approximately 1 $W/mm^2$.

In one embodiment, the deposition of the film with different film quality is conducted by controlling a substrate temperature during the deposition. In another embodiment, the substrate temperature is controlled substantially or nearly at a constant temperature of around 250° C.

FIGS. 7A to 7G are schematic drawings showing one embodiment of processes of a gap-filling of recesses or grooves with films. A first film is initially deposited in the manner as above (See FIG. 7A), and then a first etching session is conducted in the manner also described above so almost all the film deposited on a side wall of a recess or groove is removed (See FIG. 7B). And a second film is then deposited in the same manner (See FIG. 7C), and thereafter the second etching session is conducted also in the same manner (See FIG. 7D). In this way, third and fourth films can be deposited (See FIG. 7E and FIG. 7F). Finally, by conducting a last deposition of the film, the recess or groove can be completely filled without having to form a void or gap within the layer of film.

The above method becomes possible by depositing a film with different film quality on a top wall and on a side wall of recesses during the deposition and then etching the film on a side wall of recesses or grooves with no etching or only minimal etching of the film deposited on a top wall of recesses or grooves on a substrate. As the following examples show it is found out that depositing a film with different film quality on a top wall and on a side wall of recesses during the deposition is possible by controlling RF power or substrate temperature.

The present invention will be explained in detail with reference to specific examples which are not intended to limit the present invention. The numerical numbers applied in specific examples may be modified by a range of at least ±50%, wherein the endpoints of the ranges may be included or excluded.

EXAMPLES

Example 1

Deposition of a Silicon Nitride Film

In this example, a silicon nitride film was deposited on a substrate having recesses or grooves, and a Capacitively Coupled Plasma (CCP) device was used as the ALD apparatus. The film deposition conditions were as follows:
Substrate temperature: 100° C.
Film deposition pressure: 1.0 Torr
Silicon-containing precursor: BDEAS
Silicon-containing precursor pulse: 0.5 second
Flow rate of nitrogen or nitrogen and hydrogen: 1000 sccm
Flow rate of purge gas (Ar): 1000 sccm
RF power (13.56 MHz): 100-900 W The film thickness for one cycle is set to 0.1 nm. In depositing a silicon nitride film, Ar was also used throughout the cycle as a purge gas to flow into the reactor and the flow remained at a constant rate. A silicon-containing precursor is supplied with a single pulse, while nitrogen reactant gas or nitrogen and hydrogen reactant gas is introduced to the reactor continuously at a constant rate. After the silicon-containing precursor pulse stops and the unabsorbed silicon-containing gas is purged, RF power is applied with a single pulse. The silicon precursor pulse and RF power pulse do not overlap with each other. Along with the continuous flow of purge gas, the reactor is always evacuated and a constant pressure is maintained. A purge gas continues to flow even when silicon-containing precursor is being introduced via pulsing. Once the silicon-containing precursor pulse stops, however, only purge gas and nitrogen reactant gas or nitrogen and hydrogen reactant gas will flow in and therefore virtually all silicon-containing precursor can be purged from the substrate surface.

Figure 3:
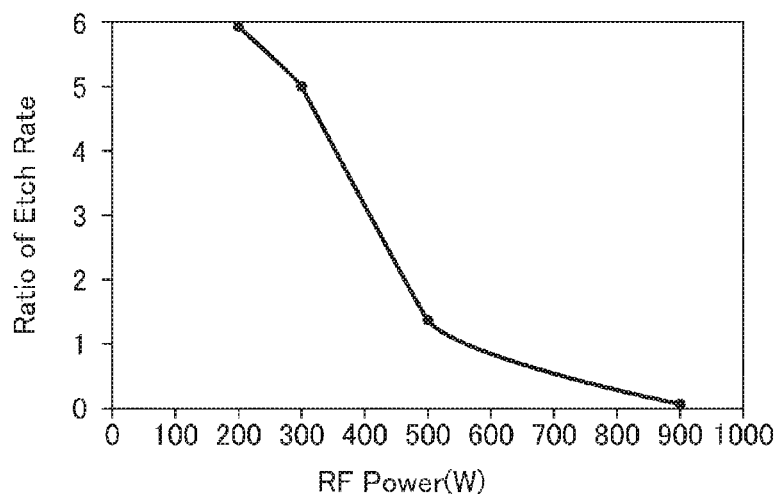
FIG. 3 is a graph showing the relationship between RF power and a ratio of the wet etching rate (nm/min) of a side wall of recesses to the wet etching rate (nm/min) of a top wall of recesses.

FIG. 3 is a graph showing the relationship between RF power and the ratio of the wet etching rate (nm/min) of a side wall of recesses to the wet etching rate (nm/min) of a top wall of recesses.

As can be seen in FIG. 3, it was found that the higher the RF power applied during the deposition session becomes, the more the film deposited on a top wall of recesses or grooves is etched during the etching session and the less the film deposited on a side wall of recesses or grooves is etched during the etching session. When performing the deposition session with the RF power set at around 900 W, the ratio is approximately 0.01, which denotes virtually only the film deposited on a top wall of recesses or grooves was etched and almost none of the film deposited on a side wall of recesses or grooves was etched in an etching session. On the other hand, when performing the deposition session with RF power set at around 180 W, the ratio is approximately 6, which denotes virtually only the film deposited on a side wall of recesses or grooves was etched and almost none of the film deposited on a top wall of recesses or grooves was etched in an etching session. As in FIG. 3, the RF power is approximately 600 W when the ratio of the wet etching rate (nm/min) of a side wall of recesses to the wet etching rate (nm/min) of a top wall of recesses is approximately 1.

Figure 4:
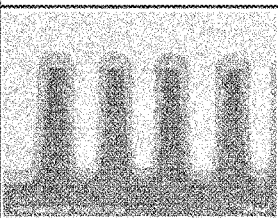
FIG. 4 shows Scanning Transmission Electron Microscope (STEM) images of cross-sectional views of silicon nitride films formed according to one example of the present invention.

FIG. 4 shows Scanning Transmission Electron Microscope (STEM) images of cross-sectional views of the silicon nitride films. As can be seen in FIG. 4, when performing the deposition session with the RF power set at 700 W, almost all of the film deposited on a top wall of recesses or grooves was etched but almost none of the film deposited on a side wall of recesses or grooves was etched. When performing the deposition session with the RF power set at 500 W, the film deposited on a top wall of recesses or grooves was more predominantly etched than that of the side wall of recesses or grooves. When performing the deposition session with the RF power set at 300 W, the film deposited on the side wall of recesses or grooves was more predominantly etched than that of the top wall of recesses or grooves.

It was found out that it becomes possible to deposit a film with different film quality on a top wall and on a side wall of recesses by controlling RF power applied during the deposition session. In this example, the diameter of approximately 300 mm of the plate (wafer) was used, and thus the ratio of the RF power to plate (wafer) diameter is calculated to be approximately 1 W/mm². It was also found out that by setting RF power to approximately 300 W, it is possible to fill recesses or grooves with film, repeating deposition and etching sessions in this way, without forming a void.

Figure 5:
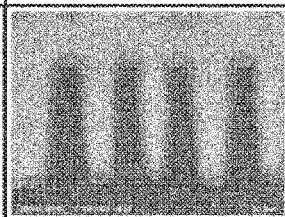
FIG. 5 shows Scanning Transmission Electron Microscope (STEM) images of cross-sectional views of the silicon nitride films.

FIG. 5 shows Scanning Transmission Electron Microscope (STEM) images of cross-sectional views of the silicon nitride films. As can be seen in FIG. 5, when performing the deposition session with the substrate temperature set at 500° C., the film deposited on a top wall and on a side wall of recesses or grooves was roughly equally etched in an etching session. When performing the deposition session with the substrate temperature set at 450° C., the film deposited on the side wall of recesses or grooves was more etched than that of the top wall of recesses or grooves in an etching session. When performing the deposition session with the substrate temperature set at 300° C., the film deposited on the side wall of recesses or grooves was more predominantly etched than that of the top wall of recesses or grooves in an etching session. Although not shown in FIG. 5, it was found out that when the substrate temperature is set at around 250° C., virtually only the film deposited on a side wall of recesses or grooves was etched and almost none of the film deposited on a top wall of recesses or grooves was etched.

It was also found out that it becomes possible to deposit a film with different film quality on a top wall and on a side wall of recesses by controlling the substrate temperature during the deposition session. It was also found out that by setting the substrate temperature to approximately 300° C., preferably to approximately 250° C., it becomes possible to fill recesses or grooves with film, repeating deposition and etching sessions in this way, without forming a void.

Example 2

Deposition of a Silicon Oxide Film

A silicon oxide film was deposited on a substrate having recesses or grooves during the deposition session and a Capacitively Coupled Plasma (CCP) device was used as the ALD apparatus. The film deposition conditions were as follows:
  Substrate temperature: 100° C.
  Film deposition pressure: 1.0 Torr
  Silicon-containing precursor: BDEAS
  Silicon-containing precursor pulse: 0.5 second
  Flow rate of oxygen: 1000 sccm
  Flow rate of purge gas (Ar): 1000 sccm
  RF power (13.56 MHz): 100-900 W The film thickness for one cycle is set to 0.1 nm. In depositing a silicon oxide film, Ar was used throughout the cycle as a purge gas to flow into the reactor and the flow remained at a constant rate. A silicon-containing precursor is supplied with a single pulse, while oxygen reactant gas is introduced to the reactor continuously at a constant rate. After the silicon-containing precursor pulse stops and the unabsorbed silicon-containing gas is purged, RF power is applied with a single pulse. The silicon precursor pulse and RF power pulse do not overlap with each other. Along with the continuous flow of purge gas, the reactor is always evacuated and a constant pressure is maintained. A purge gas continues to flow even when silicon-containing precursor is being introduced via pulsing. Once the silicon-containing precursor pulse stops, however, only purge gas and oxygen reactant gas will flow in and therefore virtually all silicon precursor can be purged from the substrate surface.

Although not shown in this example, a graph showing the relationship between RF power and the ratio of the wet etching rate (nm/min) of a side wall of recesses to the wet etching rate (nm/min) of a top wall of recesses exhibits a similar profile to that of FIG. 3. It was found in this example that the higher the RF power applied during the deposition session becomes, the more the film deposited on a top wall of recesses or grooves is etched during the etching session and the less the film deposited on a side wall of recesses or grooves is etched during the etching session. When performing the deposition session with the RF power set at around 900 W, the ratio is approximately 0.01, which denotes virtually only the film deposited on a top wall of recesses or grooves was etched and almost none of the film deposited on a side wall of recesses or grooves was etched in an etching session. On the other hand, when performing the deposition session with the RF power set at around 180 W, the ratio is approximately 6, which denotes virtually only the film deposited on a side wall of recesses or grooves was etched and almost none of the film deposited on a top wall of recesses or grooves was etched in an etching session. The RF power is approximately 600 W when the ratio of the wet etching rate (nm/min) of a side wall of recesses to the wet etching rate (nm/min) of a top wall of recesses is approximately 1. As in example 1, when performing the deposition session with the RF power set at 300 W, the film deposited on side wall of recesses or grooves was more predominantly etched than that of the top wall of recesses or grooves.

It was found out in this example that it becomes possible to deposit a film with different film quality on a top wall and on a side wall of recesses by controlling RF power applied during the deposition session. In this example, the diameter of approximately 300 mm of the plate (wafer) was used, and thus the ratio of the RF power to plate (wafer) diameter is calculated to be approximately 1 W/mm$^2$. It was also found out that by setting RF power to approximately 300 W, it is possible to fill recesses or grooves with film, repeating deposition and etching sessions in this way, without forming a void.

Figure 6:
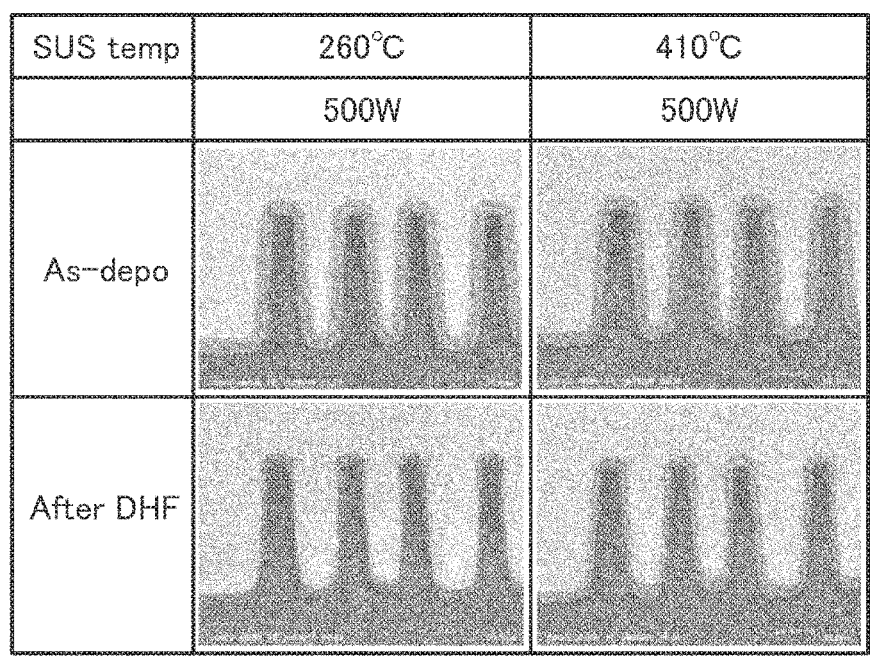
FIG. 6 shows Scanning Transmission Electron Microscope (STEM) images of cross-sectional views of the silicon nitride films deposited with RF power of 500 W.
Figure 7A:
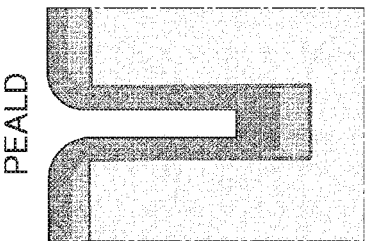
FIGS. 7A to 7G are schematic drawings showing deposition and etching of films according to an embodiment of the present invention.
Figure 7B:
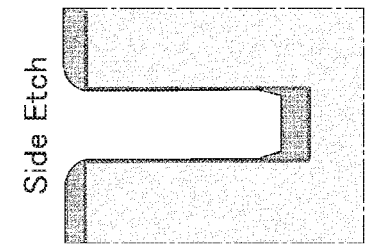
Figure 7C:
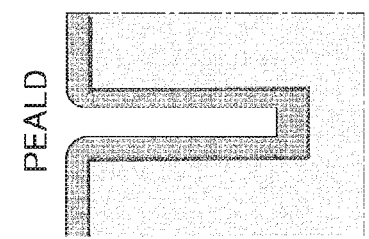
Figure 7D:
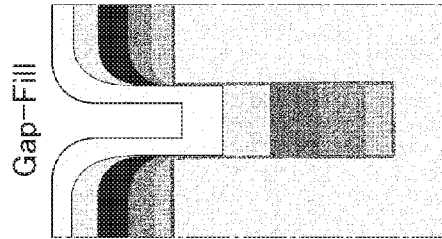
Figure 7E:
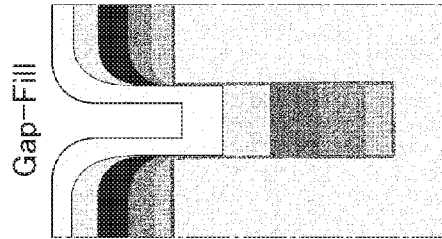
Figure 7F:
Figure 7G:
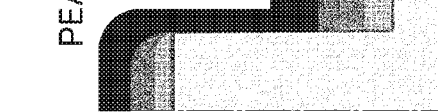

FIG. 6 shows Scanning Transmission Electron Microscope (STEM) images of cross-sectional views of the silicon nitride films deposited with RF power of 500 W. As can be seen in FIG. 6, when performing the deposition session with the substrate temperature set at 410° C., the film deposited on the side wall of recesses or grooves was more etched than that of the top wall of recesses or grooves in an etching session. When performing the deposition session with the substrate temperature set at 260° C., virtually only the film deposited on a side wall of recesses or grooves was etched and almost none of the film deposited on a top wall of recesses or grooves was etched in an etching session. Although not shown in FIG. 6, the same was true when the substrate temperature is set at around 250° C.

It was also found out that it becomes possible to deposit a film with different film quality on a top wall and on a side wall of recesses by controlling the substrate temperature during the deposition session. It was also found out that by setting the substrate temperature to approximately 300° C., preferably to approximately 250° C., it becomes possible to fill recesses or grooves with film, repeating deposition and etching sessions in this way, without forming a void.

Example 3

Etching of a silicon oxide or silicon nitride film

A silicon oxide film or a silicon nitride film on a substrate having recesses or grooves was then etched by an etching gas, which is activated by a Remote Plasma Unit. The film etching conditions were as follows:
  Substrate temperature: 100° C.
  Film deposition pressure: 1.0-10.0 Torr
  Etching gas: $NF_3$, $NF_3+NH_3$ or $NF_3+O_2$
  Flow rate of etching gas: 10-200 sccm
  Flow rate of purge gas (Ar): 1-10 slm
  RF power: 1K-5K W
  Etching gas supply time: Continuously supplied during etching session
  Etching rate: 40 nm/min After the deposition of different film quality by ALD, the thickness of the film deposited on a side wall and top wall of recesses or grooves on a substrate was approximately 10 nm. The etching rate in this example was set at 40 nm/min and the plasma power was set at 1K-5K W. It was found out that due to different film quality between film deposited on the side wall of recesses and film deposited on the top wall of recesses, it became possible to etch the film deposited on a side wall of recesses or grooves on a substrate with no or only minimal etching of the film deposited on a top wall of recesses or grooves on a substrate.

The etching can be either in situ plasma etching (etching gas is excited in the reactor) or remote plasma etching (etching gas is excited in a remote plasma unit). Also, the etching was conducted in a reactor different from that for deposition, and alternatively, the deposition and etching can be conducted in the same reactor. It was found out that the combination of the deposition session and etching session in the above manner can be repeated multiple times to form a desired target layer of film on a patterned surface, which fills recesses or grooves without having to form a void.

With respect to the use of any plural and/or singular terms herein, those having skill in the art can translate from the plural to the singular and/or from the singular to the plural as is appropriate to the context.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A method comprising:
   depositing, by PEALD or pulsed PECVD, a film on a top wall and on a side wall of recesses or grooves of a patterned surface of a substrate with a different resistance to etching between the film on the top wall and the film on the side wall by controlling a RF power or a substrate temperature;
   etching the film on the top wall and the side wall of the recesses or grooves on the patterned surface; and
   repeating the depositing and etching to satisfy a thickness of a target layer of film.

2. The method according to claim 1, wherein the depositing of the film is conducted by controlling at least the RF power and setting a ratio of the RF power to a substrate diameter to approximately 1 W/mm$^2$.

3. The method according to claim 1, wherein the depositing of the film is conducted by controlling at least the substrate temperature during the depositing, the substrate temperature being controlled substantially or nearly at a constant temperature of around 250° C.

4. The method according to claim 1, wherein in a cycle, a silicon-containing pre-cursor of the film is introduced and a purge gas is introduced to remove excess silicon-containing pre-cursor.

5. The method according to claim 1, wherein in a cycle, a silicon-containing gas is introduced in a first pulse, and RF power is applied in a second pulse, wherein the first and second pulses do not overlap.

6. The method according to claim 5, wherein the silicon-containing gas is amino silane gas.

7. The method according to claim 1, wherein a growth rate of a silicon oxide or nitride layer is about 0.10 nm/cycle.

8. The method according to claim 1, wherein the depositing comprises introducing a silicon-containing gas, the silicon-containing gas being selected from a group consisting of bisdiethylaminosilane (BDEAS), bisethylmethylaminosilane (BEMAS), trisdimethylaminosilane (3DMA), and hexakisethylaminosilane (HEAD).

9. The method according to claim 1, wherein the etching is conducted by exposing the deposited film to an activated etching gas.

10. The method according to claim 1, wherein the etching is conducted by exposing the deposited film to an activated etching gas, the etching gas being activated by a remote plasma unit and introduced into a reaction chamber where the substrate is placed.

11. The method according to claim 1, wherein the etching is conducted by exposing the deposited film to an activated etching gas, the etching gas being activated by using capacitively coupled parallel electrodes in a reaction chamber.

12. The method according to claim 1, wherein a ratio of an etching rate of the film on the side wall to that of the film on the top wall is set to between 2 and 10.

13. The method according to claim 1, wherein RF power is applied using capacitively coupled parallel electrodes, and a susceptor functions as a lower electrode and holds the substrate.

14. The method according to claim 1, wherein the depositing and etching are conducted in the same reaction chamber.

15. The method according to claim 1, wherein the depositing and etching are conducted in different reaction chambers.

16. A method comprising:
    depositing, by PEALD or pulsed PECVD, a single same film at a same time on a top wall and on a side wall of a recess or groove of a patterned surface of a substrate such that the film on the top wall exhibits a different etch rate when etched compared to the film on the side wall.

17. The method of claim 16, further comprising etching the film on the top wall and the side wall of the recess or groove on the patterned surface and repeating the depositing and etching to satisfy a thickness of a target layer of film.

18. The method of claim 16, comprising creating the difference in etch rates between the film on the top wall and the film on the side wall by controlling a RF power of the depositing.

19. The method of claim 16, comprising creating the difference in etch rates between the film on the top wall and the film on the side wall by controlling a substrate temperature of the depositing.

* * * * *